(12) United States Patent
Diehl et al.

(10) Patent No.: US 8,354,845 B2
(45) Date of Patent: Jan. 15, 2013

(54) METHOD TO DETERMINE PARAMETERS TO CONTROL THE GRADIENT COILS AND RADIO-FREQUENCY COILS OF A MAGNETIC RESONANCE DEVICE

(75) Inventors: Dirk Diehl, Erlangen (DE); Rene Gumbrecht, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 393 days.

(21) Appl. No.: 12/818,269

(22) Filed: Jun. 18, 2010

(65) Prior Publication Data

US 2010/0327867 A1 Dec. 30, 2010

(30) Foreign Application Priority Data

Jun. 18, 2009 (DE) .......................... 10 2009 025 476

(51) Int. Cl.
*G01V 3/00* (2006.01)

(52) U.S. Cl. ...................................................... 324/309

(58) Field of Classification Search .......... 324/300–322; 600/407–445
See application file for complete search history.

(56) References Cited

U.S. PATENT DOCUMENTS

| 7,275,010 | B2 | 9/2007 | Mitschang | |
|---|---|---|---|---|
| 8,063,637 | B2 * | 11/2011 | Xu et al. | 324/314 |
| 8,120,359 | B2 * | 2/2012 | Diehl et al. | 324/309 |
| 2010/0253336 | A1 * | 10/2010 | Schneider et al. | 324/309 |
| 2010/0253344 | A1 * | 10/2010 | Fautz | 324/309 |

OTHER PUBLICATIONS

"Spatial Domain Method for the Design of RF Pulses in Multicoil Parallel Excitation," Grissom et al. Magnetic Resonance in Medicine, vol. 56, (2005) pp. 620-629.

"Chebyshev Series for Designing RF Pulses Employing an Optimal Control Approach," Ulloa et al., IEEE, Trans. on Medical Imaging, vol. 23, No. 11 (2004) pp. 1445-1452.
Iterative RF Pulse Design for Multidimensional, Small-Tip-Angle Selective Excitation, Yip et al., Magnetic Resonance in Medicine, vol. 54, (2005) pp. 908-917.
"Additive Angle Method for Fast Large-Tip-Angle RF Pulse Design in Parallel Excitation," Grissom et al., Magnetic Resonance in Medicine, vol. 59, (2008) pp. 779-787.

* cited by examiner

*Primary Examiner* — Brij Shrivastav
(74) *Attorney, Agent, or Firm* — Schiff Hardin LLP

(57) ABSTRACT

In a method for examination subject-specific determination of parameters for activating gradient coils and radio-frequency of a coil array of a magnetic resonance device to generate a radio-frequency pulse with which nuclear spins in an examination region of an examination subject are moved out of a rest state by an arbitrary angle, a control unit activates phases and amplitudes of currents in the radio-frequency coils and respective currents in the gradient coils in a time-dependent manner in discrete steps to generate gradient fields. In a processor in communication with the control unit, parameters for the activation are automatically calculated dependent on measured sensitivity maps of the radio-frequency coils at the examination subject. The processor optimizes a non-linear equation system within the numerical calculation of the parameters involving a desired magnetization and a theoretical calculated real magnetization. The Jacobian matrix of the real magnetization is calculated in the determination of the parameters dependent on the direction of decline of the magnetization. The matrix elements of the Jacobian matrix consist of products of individual rotations that are determined from the optimized parameters. In the calculation of each matrix element, only factors in which the corresponding parameter is associated with the time step of the matrix element are determined.

2 Claims, 3 Drawing Sheets

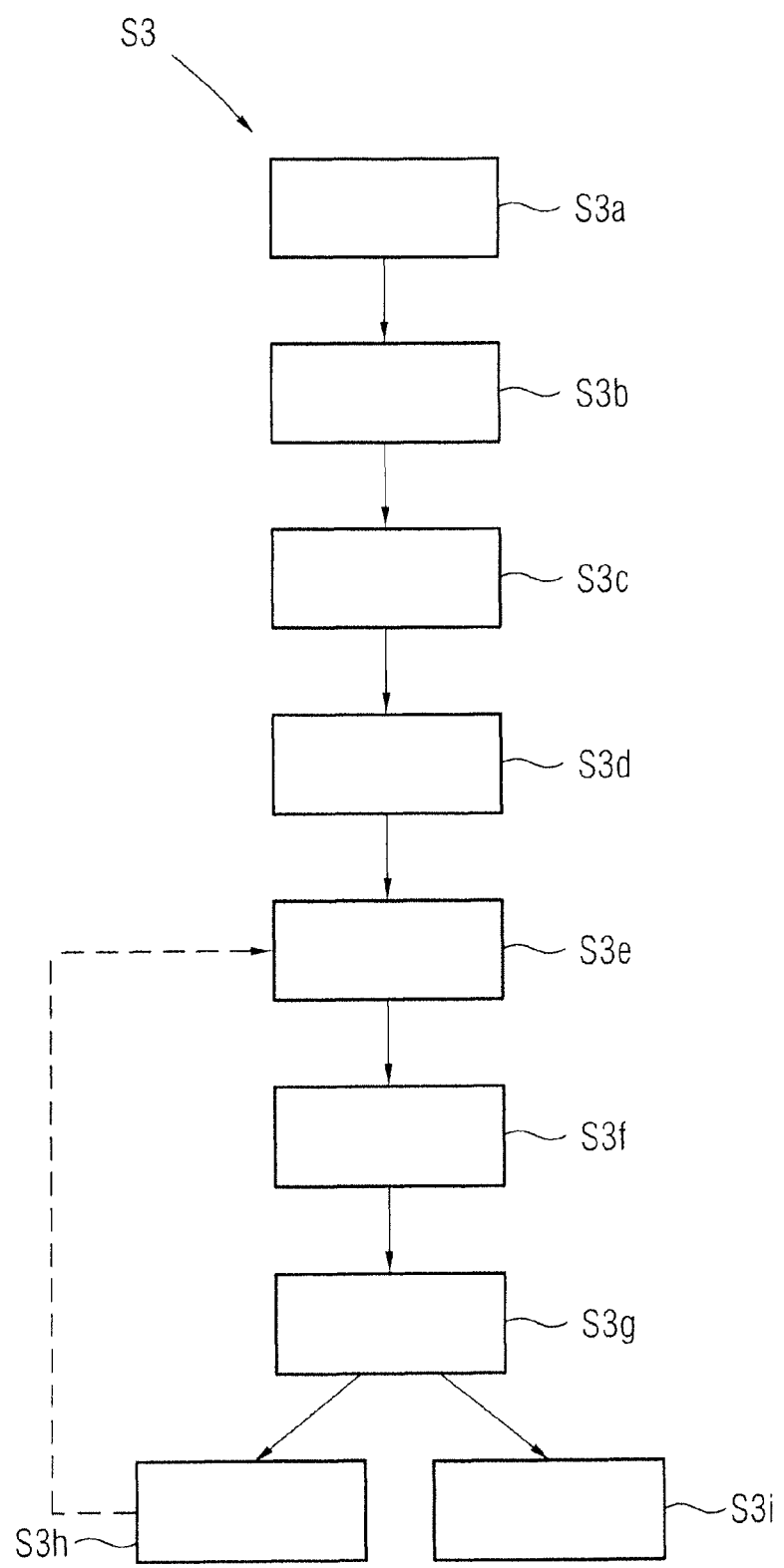

METHOD TO DETERMINE PARAMETERS TO CONTROL THE GRADIENT COILS AND RADIO-FREQUENCY COILS OF A MAGNETIC RESONANCE DEVICE

BACKGROUND OF THE INVENTION

1. Field of the Invention

The present invention concerns a method for examination subject-dependent determination of parameters to control the gradient coils and radio-frequency coils of a coil array of a magnetic resonance device to generate a radio-frequency pulse with which the nuclear spins in the examination region of the examination subject can be moved out of the rest state by an arbitrary angle.

2. Description of the Prior Art

It is known to vary the amplitude and phase of the current of a radio-frequency coil in a magnetic resonance apparatus in a time-dependent manner in order to move the nuclear spins in the examination region of an examination subject out of their rest position. This time-dependent series of amplitudes and phases is also called an excitation profile. These pulses—known as sinc pulses—in combination with a constant gradient field produce the excitation of a slice with a rectangular cross section profile. If the excitation profile has the shape of a Gaussian distribution, the excited slice also exhibits a Gaussian profile.

The relationships between the excitation profile of the radio-frequency pulse and the cross sectional shape of the excited slice is provided for small pulse angles by the Fourier transformed excitation profile of the radio-frequency pulse. In this context, "small" indicates an angle of approximately $\leq 5°$.

Such a simple calculation of an excitation profile is only possible under the assumption that the sensitivity of the radio-frequency coil or of the radio-frequency coils is homogeneous in the entire examination region. Otherwise, the spins in different regions of the excited slice are deflected with different angles.

In reality, the assumptions that are made are rarely fulfilled. Excitation angles of 90° are always used in spin echo-based sequences and a homogeneous coil sensitivity is never present in modern coil arrays. Otherwise the signals acquired by means of parallel imaging cannot be differentiated, which would make parallel imaging impossible.

Moreover, it is not sufficient to take into account only the coil sensitivities of individual coils of a coil array in a homogeneous phantom since the deflection angles generated by the coils also depend on the condition of the examination subject. The excitation profiles of the individual coils must accordingly be recalculated for each examination subject.

SUMMARY OF THE INVENTION

An object of the present invention is to provide a method of the aforementioned type that allows the determination of parameters for examination subject-specific activation of the gradient coils and radio-frequency coils of a magnetic resonance device.

To achieve this object, a method of this type is provided, wherein the amplitudes and phases of the currents of the radio-frequency coils and the respective currents of the gradient coils are activated in a time-dependent manner in discrete time steps to generate the gradient fields, to determine the parameters, a program means is used for a numerical calculation of the parameters, the calculation of the parameters ensues depending on measured sensitivity maps of the radio-frequency coils at the examination subject, an optimization of the nonlinear equation system $\arg_b \min\{\|M_{theor} - M_{theor}\|\}$ is determined within the scope of the numerical calculation, wherein $M_{desired}$ represents the desired magnetization and $M_{theor}$ represents the theoretical calculated real magnetization.

and the Jacobian matrix of the real magnetization is calculated within the scope of the determination of the result of the optimization under consideration of the direction of decline, wherein the matrix elements of the Jacobian matrix consist of products of individual rotations $f_{ji}$, the individual rotations $f_{ji}$ are determined from the optimized parameters, and in the calculation of a matrix element, only those factors in which the corresponding parameter is associated with the time step of the matrix element are redetermined.

This method is based on the insight that the rotation of the magnetization that is produced by the radio-frequency coils and gradient coils can be understood as a sequence of successive, independent rotations. The amplitudes and phases of the currents of the radio-frequency coils and the gradient coils are divided into a specific number of time steps and viewed as constant in these time steps. These time steps typically have the same length, for example 10 μs. If a radio-frequency pulse has a duration of 2 ms, for example, it can be divided into 200 steps of 10 μs in length each. The amplitude and the phase of the current are to be established for each coil and the respective current is to be established for each gradient coil for each of these 200 steps or for each of these 200 intervals. In the case of 8 coils and 3 gradient coils, 19 parameters are consequently to be established for each of the 200 intervals. 3,800 variables are thus to be determined to define the complete excitation profile. For pulse angles greater than 5°, the calculation of these variables is already not possible with known methods in an appropriate time period for this coil count (which is considered low).

The calculation of these parameters—that can easily be increased by a multiple given the use of a higher coil count or a larger number of time steps—must be conducted before the implementation of the actual magnetic resonance experiments. The parameters that are thereby determined are then used given the use of measurement sequences to generate the magnetic resonance signals. The time frame that is provided for this is at maximum in the range of a few minutes.

The following serves to present the background of the invention in more detail.

Spins in an external magnetic field precess around the primary axis of the magnetic field. In NMR this is typically designated with $B_0$. By definition, this basic magnetic field $B_0$ lies in the z-direction. The magnetic moment of the spins in the xy-direction cancels due to the high precision frequency; a portion that does not disappear remains only in the z-direction. In a macroscopic sample, the spins in the thermal steady (equilibrium) state distribute at the energy level according to the Boltzmann statistics. The levels of lower energy are more significantly populated, from which a macroscopic magnetization $M_0$ arises in the direction of the basic magnetic field $B_0$. This magnetization $M_0$ is also designated as the rest magnetization.

The magnetization $M_0$ can be swung out of the rest state via application of an additional magnetic field $B_1$ (the radio-frequency pulse). The angle by which the rest magnetization $M_0$ is rotated out of the z-direction depends on the strength of the additional magnetic field $B_1$ and its duration $\Delta t$:

$$\phi = \gamma |B_1| \Delta t. \quad (1)$$

The field strength of the additional magnetic field $B_1$ can be time-dependent.

Instead of a single macroscopic magnetization, spatially dependent macroscopic magnetizations $M_j$ can also be considered in that the sample is divided into J volumes. The strength of the gradient fields and the additional magnetic fields $B_1(j)$ is then different for each of these locations j. As described above, an additional magnetic field $B_1$ generated by a coil thereby depends on the amplitude and the phase of the current of the coil. Furthermore, the sensitivity of the coil at the location j must be taken into account. If the parameters for operation of the coils and the gradient fields are combined into what is known as an excitation amplitude b, the magnetization $M_j$ depends on the excitation amplitudes $b_i$ at the points in time i:

$$|M_j| = f_j(b_1, b_2, \ldots, b_I) \quad (2).$$

The vector $b_i$ thus designates the excitation amplitude for the time step i. This equation must be optimized for all locations j simultaneously. In the calculation, it is thereby assumed that the excitation amplitude $b_i$ is constant in a time step.

The function $f_j$ is nothing other than a chaining of rotations. The rotation parameters thereby depend on the excitation amplitudes b. In order to optimize the parameters of the excitation amplitudes b, the Jacobian matrix $$\partial b_i f_j \quad (3)$$

is used in what are known as fixed point iterations within the scope of optimization methods. Normally the corresponding derivation is to be determined for each location j and each time step i. Given 200 time steps and, for example, 100 volumes j, 20,000 derivations to be calculated thus result per iteration step of the optimization method.

However, a simplification can be made for the calculation of the magnetization M given a more precise consideration of the function $f_j$. Then the excitation amplitude $b_i$ acts only on the rotation at the point in time i. All other rotations are independent and remain as constant factors in the calculation of the derivation:

$$\partial b_i f_j = f_{j1} \cdot f_{j2} \cdot \ldots \cdot (\partial b_i f_{ji}) \cdot \ldots \cdot f_{jN}. \quad (4)$$

The product of the individual rotation $f_{ji}$ describes the connection in series of two rotations. These are not commutative. In the final effect, this means that the transposition of the excitation amplitudes at two different points in time does not generate the same magnetization M. Through the analytical consideration of the function $f_j$ it results that, in the scope of the optimization method, in an iteration step only the derivation relative to the corresponding time step i must be recalculated after recalculation of $f_{ji}$ from the modified excitation amplitudes $b_i$ for each matrix element of the Jacobian matrix. For the calculation of the matrix element $\partial b_i f_j$, the known factors $f_{j1}$, $f_{j2}$ etc. are thus reused; only the factor $\partial b_i f_{ji}$ is recalculated. The index i of the individual rotation $f_{ji}$ and the of excitation amplitude $b_i$ thereby correspond. Although all matrix elements of the Jacobian matrix are recalculated in each optimization step, all factors for calculation of the matrix elements are respectively known in advance except for a respective factor. However, in the case of 100 volumes, for example, this means that only 100 derivations are to be calculated instead of 20,000. Within the scope of the iteration, in the present example the calculation of the new derivations of the Jacobian matrix thus ensues faster by a factor of 200.

For illustration, in the following a specific design of the function $f_j$ is described, but the method according to the invention is not limited to this embodiment; it is only to be considered as an example.

For calculation of the activation parameters, the solution of a nonlinear equation system that can be described as a sequence of I rotations D is required:

$$M = M_{0,j} \cdot D_{1,j} \cdot D_{2,j} \cdot \ldots \cdot D_{I,j} \quad (5)$$

wherein $M_{0,j}$ designates the rest magnetization in the volume j. $D_{1,j}$ is the rotation matrix with which the rotation at the time step 1 is provided at the location j. Given specification of I time steps, a corresponding number of rotation matrices D exist.

In addition to rotation matrices, what are known as quaternions can also be used to describe rotations. Quaternions are the expansion of the complex numbers in four dimensions, wherein a quaternion q is given via:

$$q = a + ib + jc + kd. \quad (6)$$

The following calculation rules apply:

$$ijk = -1 \quad (7)$$

and $$i^2 = j^2 = k^2 = -1 \quad (8)$$

Given a rotation in three-dimensional space, $M_{t-1}$ designates the magnetization before the rotation and $M_t$ designates the magnetization after the rotation; it applies that:

$$M_t = q M_{t-1} q^* \quad (9)$$

The quaternion q for rotation of the magnetization is provided via:

$$q = \cos(\phi/2) + \frac{1}{|B|}(B_z i + B_y j + B_x k)\sin(\phi/2) \quad (10)$$

B and its components thereby designate the additional magnetic field that consists of the magnetic fields generated by the coils and the gradient fields generated by the gradient coils. ▢ indicates the rotation angle relative to the z-direction, thus the direction of the rest magnetization. It is a difference angle between $M_t$ and $M_{t-1}$.

In this notation the magnetizations $M_t$ and $M_{t-1}$ are given via:

$$M_{t-i} = M_z(t)i + M_y(t)j + M_x(t)k \quad (11)$$

and $$M_{t-1} = M_z(t-1)i + M_y(t-1)j + M_x(t-1)k. \quad (12)$$

Since the rest magnetization $M_0$ exists in the direction of the $B_0$ field and the resulting magnetization is normalized to the rest magnetization, the initial vector of the magnetization has a length of 1 and the following simplification results for the first rotation:

$$M_1 = q i q^*. \quad (13)$$

The notation of the quaternion q can be simplified using the variables U and V defined in the following. If $$\alpha = \cos(\phi/2) + i\frac{G}{|B|}\sin(\phi/2) = \cos(-\phi/2) - i\frac{G}{|B|}\sin(-\phi/2) \quad (14)$$

and $$\beta = i(B_x + iB_y)\frac{1}{|B|}\sin(\phi/2) = -i(B_x + iB_y)\frac{1}{|B|}\sin(-\phi/2) \quad (15)$$

are set, q results as $$q = \alpha - j\beta. \quad (16)$$

The rotation of the rest magnetization that is described in Equation (13) can therefore also be expressed as follows:

$$M_1 = i(|\alpha^2| - |\beta^2|) + k2\alpha^*\beta. \quad (17)$$

The components of the vector of the rotated magnetization accordingly result as $$M_x = \Re(2\alpha^*\beta), \quad (18)$$

$$M_y = \Im(2\alpha^*\beta) \quad (19)$$

and $$M_z = |\alpha^2| - |\beta^2|, \quad (20)$$

wherein $\Re$ and $\Im$ respectively designate the real part and the imaginary part. This additional magnetic field B in Equations (14) and (15) and its components have been determined depending on the acquired sensitivity maps; this measured information is thus considered over $\alpha$ and $\beta$ or, respectively, $U_t$ and $V_t$ in the following.

A composition of two rotations corresponds to a multiplication of the corresponding quaternions:

$$q_3 = q_2 q_1, \quad (21)$$

wherein the first rotation is indicated with the index 1, the second rotation is indicated with the index 2 and the resulting rotation is indicated with the index 3. The components of the vector of the rotated magnetization thus result entirely from the variables $\alpha$ and $\beta$. The rotation angle □, the components of the additional magnetic field B generated by the coils and the components of the gradient fields G are contained in these variables.

If Equation (21) is written out with $\alpha$ and $\beta$ for t chained rotations, a recursion relationship is obtained, wherein $U_i$ and $V_i$ represent the chaining of the first rotations:

$$U_i = \alpha_i U_{i-1} - \beta_i^* V_{i-1} \quad (22)$$

and $$V_i = \beta_i U_{i-1} + \alpha_i^* V_{i-1} \quad (23)$$

A recursion relationship can analogously be found wherein $U'_i$ and $V'_i$ represent the chaining of the last t-i rotations. t is the number of rotations in total.

$$U'_{i-1} = U'_i \alpha_i^* + V'_i \beta_i^*, \quad (24)$$

$$V'_{i-1} = V'_i \alpha_i - U'_i \beta_i \quad (25)$$

From this it follows for the transverse real magnetization that:

$$M_{trans} = 2U_t^* V_t \quad (26)$$

The derivations of the parameters $U_t$ and $V_t$ after the optimization $b_i$ are now the links from $U_{i-1}, V_{i-1}$ with $\alpha'_i, \beta'_i$ and $U'_{i+1}, V'_{i+1}$ according to the rules of Equations 22, 23 or, respectively, 24, 25, wherein $\alpha'_i, \beta'_i$ represent the derivations of $\alpha$ and $\beta$ after $b_i$ as indicated in Equation (4).

The derivations of the parameters $U_t$ and $V_t$ according to the optimization parameters $b_i$ represent the matrix elements of the Jacobian matrix:

$$\frac{\partial}{\partial b_i}(2U_t * V_t) = \frac{4}{|2U_t * V_t|}\left[\Re\left(\frac{\partial U_t^*}{\partial S_n}U_t\right)|V_t|^2 + \Re\left(\frac{\partial V_t}{\partial S_n}V_t^*\right)|U_t|^2\right] \quad (27)$$

With these methods only two operations according to Equations 22 and 23 or, respectively, 24 and 25 must be implemented to calculate the Jacobian matrix per time step. Moreover, an additional two of these operations and the derivation $\alpha'$ and $\beta'$ must be calculated per optimization parameter.

Since a great deal more than one optimization parameter is present per time step (number of coils*2+number of gradient coils), the number of operations per optimization parameter drops further. The number of operations is in any case independent of the number of time steps.

In the known methods of calculation of the Jacobian matrix with finite differences, t operations according to Equations 22 and 23 must be implemented per optimization parameter t. Since this must be calculated for t time steps and a few optimization parameters per time step, here the number of operations increases quadratically with the number of the time step; however, in the method according to the invention it is only linear.

The angle by which the spins are moved out of the rest state can advantageously be greater than 10°. The method enables the calculation of parameters for the deflection of the spin by arbitrary angles. However, the calculation of deflection angles or, respectively, flip angles of >10° can only be determined in an acceptable amount of time with the method according to the invention.

Calculations of the theoretical real magnetization decrease operators can thus advantageously be used that are a measure of the rotation of the real magnetization. These decrease operators have already been described. Their use is particularly advantageous in the numerical calculation of the parameters for the activation of the gradient coils and radio-frequency coils.

BRIEF DESCRIPTION OF THE DRAWINGS

FIG. 6 is a detailed workflow diagram of Step S3 of the method.

DESCRIPTION OF THE PREFERRED EMBODIMENTS

Figure 1:
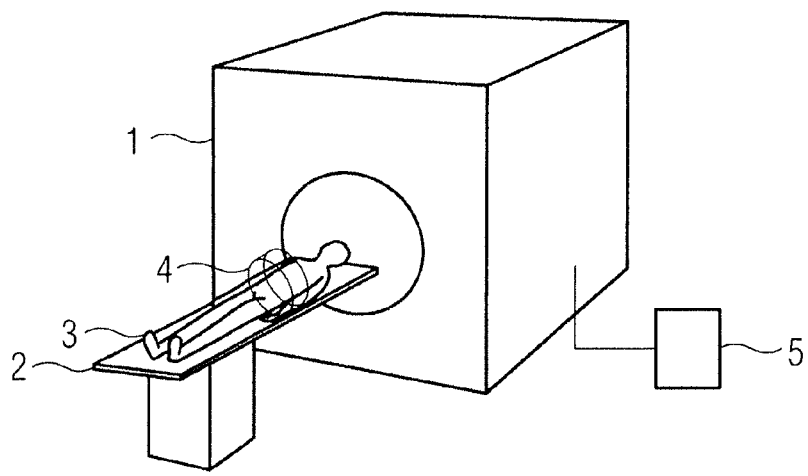
FIG. 1 schematically illustrates a magnetic resonance system.

FIG. 1 shows a magnetic resonance system 1 with a patient bed 2 to support the patient 3. To implement the measurements, a coil array 4 made up of individual coils to conduct parallel imaging is arranged on the patient 3. The magnetic resonance device is controlled by a control device 5. The method according to the invention is implemented by a processor in, or in communication with, the control device 5. Typical components of a magnetic resonance system such as gradient coils, the primary field coil, amplifiers etc. are sufficiently known to the man skilled in the art and therefore are not shown in detail.

Figure 2:
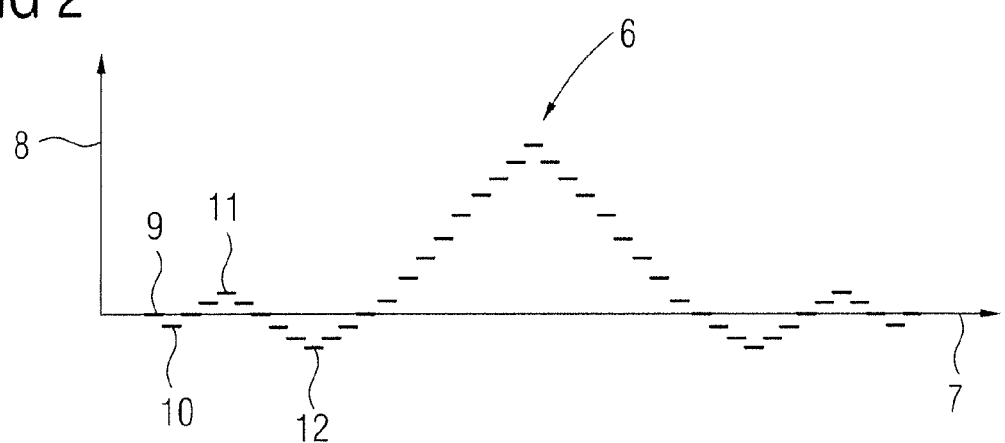
FIG. 2 shows a sinc pulse.

FIG. 2 shows a sinc pulse 6. The time is plotted on the x-axis 7 while the amplitude is shown on the y-axis 8. The sinc pulse 6 is subdivided into time segments, wherein four segments have been identified with the reference characters 9, 10, 11 and 12. Each segment represents a time step. The naming of the pulse originates from the imaginary shape of a connecting line between the individual segments that is based on a sinc curve. The individual segments—thus also the segments 9, 10, 11 and 12—are all 10 μs long. In total, the sinc pulse 6 consists of 256 segments, which is why it has a total length of 2.56 ms. To control a coil, the amplitude value (as an absolute value) and the phase are typically passed to the control device. The segment 9 accordingly has a phase and an amplitude of 0, while segment 10 exhibits a positive amplitude value while the phase is π or 180°. Contrary to this, the amplitude value of the segment 11 is even greater but its phase is 0 again. Negative amplitude values are accordingly indicated with a phase of π or 180°. In contrast to this, positive amplitude values have a phase of 0.

Figure 3:
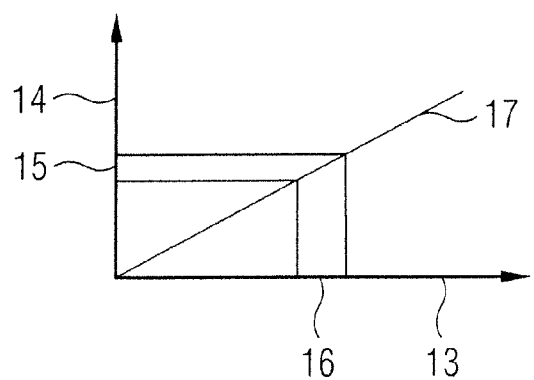
FIG. 3 is a schematic illustration of the slice selection by means of a gradient and a radio-frequency pulse.

FIG. 3 shows how a slice selection occurs by means of the radio-frequency pulse. In FIG. 3 the location z is plotted on the x-axis 13 while the y-axis 14 shows the frequency ω. Since the radio-frequency pulse has a certain bandwidth Δω 15, a slice Δz 16 with a specific width is excited using a gradient field (represented here by the line 17). The thickness of the slice Δz 16 thus depends on the strength of the gradient field and the bandwidth Δω 15 of the radio-frequency pulse. These determinations apply for radio-frequency pulses with arbitrary profile; they are thus not limited to radio-frequency pulses with sinc profile.

Figure 4:
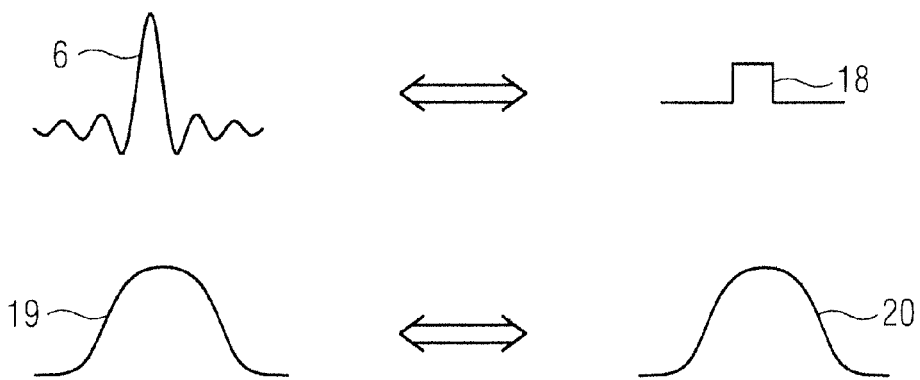
FIG. 4 is a workflow diagram of the method according to the invention.

The profile of the radio-frequency pulse thereby tunes [sic] the precise shape of the excited slice. It would be desirable to deflect all spins by exactly the same angle in a sharply delimited slice (a perfectly rectangular slice, so to speak). Given the use of a homogeneous medium and a radio-frequency coil that possesses a homogeneous sensitivity profile, a sinc pulse comes closest to this ideal, as is shown in FIG. 4. Under the cited assumptions (among which is also the aforementioned excitation angle≦5°), the sinc pulse 6 generates a perfect rectangular profile. Spins that lie in the affected slice are deflected by the same angle. Spins outside of this slice are not detected at all. The deflection angle thereby depends on the damping and the duration of the pulse.

In contrast to this, if a radio-frequency pulse with a Gaussian profile is used (such as the Gaussian pulse 19), a Gaussian slice profile 20 is also obtained. In this case the spins are no longer deflected by the same angle; rather, the deflection follows the shown Gaussian profile. This means that the spins in the center experience a greater deflection than the spins at the edge of the slice. A sharp demarcation of this slice is also no longer present.

For small pulse angles, the pulse and slice profiles can be exchanged, to the effect that a rectangular pulse profile generates a sinc-shaped slice profile, for example. These dependencies are provided via the Fourier transformation. This means that the Fourier-transformed pulse profile yields the slice profile.

In practice, the requirement of the presence of a small angle (thus an angle≦5°) is already often not satisfied. In this case the excitation profile of the radio-frequency pulse can be determined for larger angles by means of specialized calculation algorithms. For example, such an algorithm is known under the name Shinnar-Le Roux. In order to generate good slice profiles with such calculated activation parameters, however, it is furthermore required that the employed coil has a homogeneous sensitivity and that the sample is homogeneous. In order to overcome the last two requirements, it is necessary to individually determine the parameters for activation of the radio-frequency coils and gradient coils for each examination subject.

Figure 5:
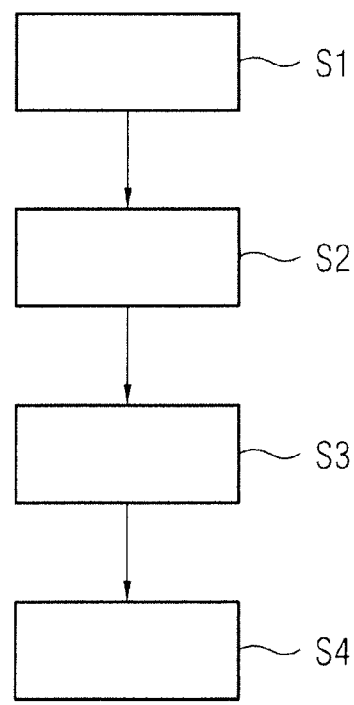
FIG. 5 is a workflow diagram of Step S3 of the method.

FIG. 5 shows the corresponding workflow. In a first Step S1 the patient is passed to the measurement position in the magnetic resonance system 1. For this he is borne on the patient bed 2 and the coil array 4 is positioned on the patient bed 2.

In the next Step S2 the sensitivity maps are acquired. A separate sensitivity map is thereby acquired for every radio-frequency coil; the acquisition of such maps is sufficiently known to the man skilled in the art. A standard radio-frequency pulse—for example a sinc pulse 6—is hereby used. Furthermore, the desired magnetization $M_{desired}$ is provided. For example, the specification of a single rotation angle by which the magnetization should be homogeneously rotated in all sub-volumes after I time steps is sufficient for this. However, arbitrary specifications can be set, thus even the specification of 0°, meaning no rotation of the magnetization out of the rest state in specific image regions. The parameters for activation of the radio-frequency coils and the gradient coils are subsequently determined as slice [sic] S3. As soon as these are known, the actual experiments or, respectively, measurements that are to be conducted can be conducted according to Step S4.

In this workflow the calculation of the parameters to control the radio-frequency coils and gradient coils in Step S3 is critical. This is therefore shown in detail in FIG. 6.

To calculate the sought parameters, these are set to start values in Step S3a. For example, the currents can all possess the same amplitude and the same phase while the gradient coils can likewise possess a uniform activation current. With these values the theoretical expected magnetization $M_{theor}$ is determined using the Bloch equation (S3b) in order to compare this with the predetermined desired magnetization $M_{desired}$ in the next Step S3c. As expected, differences hereby result, and if these differences exceed predetermined thresholds a complete Jacobian matrix of the parameters is calculated. The sample volume is divided into sub-volumes in the calculation of the theoretical expected magnetization $M_{theor}$. These sub-volumes are continuously numbered; therefore a single index (this being j) is also sufficient for three-dimensionally arranged sub-volumes. The theoretical magnetization $M_{theor}$ is accordingly to be calculated at each location j. As described above, the parameters exist for the activation of the radio-frequency coils and the gradient coils in discrete steps. For example, such a step has a length of 10 μs. I additional time steps or, respectively, time-dependent values are accordingly to be determined depending on the total length of the radio-frequency pulse or the provided number of nodes. The total number of parameters to be determined therefore results as I·(2·number of radio-frequency coils+number of gradient coils). Even for a relatively rough division of the examination volume into 100 sub-volumes and a count of 256 time steps, the considerable number of 4864 parameters to be calculated results for a relatively small coil array with eight radio-frequency coils and three gradient coils. The Jacobian matrix in this case comprises I·J·(2·number of radio-frequency coils+number of gradient coils), thus 486,400 elements.

Possible thresholds for the termination of the optimization can, for example, be the deviation of the deflection angle of the magnetization $M_{theor}$ in comparison to the desired magnetization $M_{desired}$, or even the number of sub-volumes whose deflection angle of the magnetization exceeds a specific measurement.

In any case, it is to be assumed that the specification of the start values in which the sensitivity maps have not yet been taken into account still does not possess the optimal parameters. Therefore the complete Jacobian matrix according to Equation (3) is determined as Step S3d. This is a time-consuming step if finite elements are used for this. In the next Step S3e this Jacobian matrix is required within the scope of the optimization algorithm since this provides what is known as the decrease direction. The optimization algorithm (whose single requirement is the use of a decrease direction) changes arbitrarily many parameters in a first iteration, corresponding to the specification of the optimization algorithm. The theoretical magnetization $M_{theor}$ is calculated again with these changed values and compared with the desired magnetization $M_{desired}$ (Steps S3f, S3g). If the difference of the magnetizations exceeds the predetermined thresholds, a new Jacobian matrix of the activation parameters is calculated as Step S3h. For this new individual rotations $f_{ji}$ are calculated from the current (i.e. original and changed) parameters. For the calculation of the matrix elements of the Jacobian matrix, only one of the individual rotations must thereby respectively be recalculated according to Equation (4). A prototype for calculation of the matrix elements of the Jacobian matrix exists, so to speak; starting from this, one arrives at a matrix element by modifying the factor in which the corresponding parameter $b_i$ is associated with the time step of the matrix element. Since the rotations made in the individual time steps are independent of one another, it is sufficient to redetermine the elements of the Jacobian matrix associated with the respective time step. In the predetermined example with 100 sub-volumes, 256 time steps and 19 parameters, the cost for recalculation of the Jacobian matrix can therefore be minimized to one-256th of the initial cost. This calculation is the most expensive calculation step due to the plurality of parameters to be optimized, and this savings therefore for the first time enables parameters for the activation of radio-frequency coils and gradient coils to be calculated specific to the examination subject for even arbitrary angles of the deflection of the magnetization.

This modification of the activation parameters is continued until, in Step S3g, the theoretical magnetization $M_{theor}$ no longer falls below or exceeds any of the predetermined thresholds, and the parameters are adopted as a final Step S3i. The subsequent examination can then be implemented with these parameters.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for examination subject-specific determination of parameters for activating gradient coils and radio-frequency coils of a coil array of a magnetic resonance apparatus, comprising the steps of:

from a control unit, activating amplitudes and phases of currents in radio-frequency coils and respective currents in gradient coils of a magnetic resonance system in a time-dependent manner in discrete time steps to generate gradient fields and a radio-frequency pulse that move nuclear spins in an examination region of an examination subject in the magnetic resonance system out of a rest state by an arbitrary angle;

in a processor in communication with said control unit, automatically calculating parameters in order to activate said radio-frequency coils and said gradient coils dependent on measured sensitivity maps of the radio-frequency coils at the examination subject by implementing a numerical calculation in the processor;

in said numerical calculation in said processor, optimizing a non-linear equation system $arg_b \min\{\|M_{theor} - M_{desired}\|\}$ wherein $M_{desired}$ represents a desired magnetization in the examination subject and $M_{theror}$ represents a theoretical, calculated real magnetization in the examination subject; and in said processor, calculating the Jacobians matrix of said real magnetization in the optimization of said non-linear equation system dependent on a direction of decline of said magnetization, to generate matrix elements of said Jacobian matrix consisting of products of individual rotations that are determined from the optimized parameters and, for each matrix element, calculating only factors for which a corresponding parameter is associated within a time step represented by the matrix element.

2. A method as claimed in claim 1 comprising generating said parameters to move said nuclear spins from said rest state by an angle that is greater than 10°.

* * * * *